US012644945B2

(12) United States Patent
Kamba et al.

(10) Patent No.: US 12,644,945 B2
(45) Date of Patent: Jun. 2, 2026

(54) MAGNETIC RESONANCE IMAGING SYSTEM AND OPERATION METHOD OF MAGNETIC RESONANCE IMAGING SYSTEM

(71) Applicant: FUJIFILM Healthcare Corporation, Chiba (JP)

(72) Inventors: Kazuho Kamba, Chiba (JP); Yoshitaka Sato, Chiba (JP); Suguru Yokosawa, Tokyo (JP)

(73) Assignee: FUJIFILM Corporation, Tokyo (JP)

( * ) Notice: Subject to any disclaimer, the term of this patent is extended or adjusted under 35 U.S.C. 154(b) by 198 days.

(21) Appl. No.: 18/740,470

(22) Filed: Jun. 11, 2024

(65) Prior Publication Data

US 2024/0418813 A1 Dec. 19, 2024

(30) Foreign Application Priority Data

Jun. 15, 2023 (JP) ................................. 2023-098414

(51) Int. Cl.
| | |
|---|---|
| *G01R 33/56* | (2006.01) |
| *G01R 33/483* | (2006.01) |
| *G01R 33/561* | (2006.01) |
| *G01R 33/563* | (2006.01) |
| *G01R 33/565* | (2006.01) |

(52) U.S. Cl.
CPC ...... *G01R 33/5611* (2013.01); *G01R 33/4835* (2013.01); *G01R 33/5608* (2013.01); *G01R 33/56341* (2013.01); *G01R 33/56509* (2013.01)

(58) Field of Classification Search
CPC ............ G01R 33/5611; G01R 33/4835; G01R 33/5608; G01R 33/56341; G01R 33/56509
See application file for complete search history.

(56) References Cited

U.S. PATENT DOCUMENTS

| | | | |
|---|---|---|---|
| 10,746,832 B2 | 8/2020 | Huang et al. | |
| 11,940,520 B2 | 3/2024 | Sato et al. | |
| 2017/0254869 A1* | 9/2017 | Miyazaki | ......... G01R 33/56509 |

FOREIGN PATENT DOCUMENTS

| | | |
|---|---|---|
| JP | 2019503750 | 2/2019 |
| JP | 2023032832 | 3/2023 |

* cited by examiner

*Primary Examiner* — G.M. A Hyder
(74) *Attorney, Agent, or Firm* — JCIPRNET

(57) ABSTRACT

Provided are a magnetic resonance imaging system and an operation method of a magnetic resonance imaging system that generate a reconstructed image with an improved signal-to-noise ratio. A magnetic resonance imaging system includes a magnetic resonance imaging apparatus, a processor, and a memory. The processor uses the magnetic resonance imaging apparatus to perform a plurality of imaging operations on the same slice of a subject in accordance with an imaging sequence, collects pieces of measurement data indicating nuclear magnetic resonance signals in correspondence with the plurality of imaging operations, acquires a common solution to be used in a case of generating a single final image in a real space from the pieces of measurement data collected in the plurality of imaging operations, and generates the final image by using the pieces of measurement data collected in the plurality of imaging operations and the common solution.

11 Claims, 13 Drawing Sheets

FIG. 2

MAIN SCAN               NAVIGATOR SCAN

CONVENTIONAL: SOLUTION IS
CALCULATED FOR EACH NSA $$S_1 = B_1 m_1$$

$$S_2 = B_2 m_2$$

$$S_3 = B_3 m_3$$

$$S_4 = B_4 m_4$$

$$m_i = (B_i^H \Sigma^{-1} B_i)^{-1} B_i^H \Sigma^{-1} S_i$$

$$m = (1/NSA) \sum_i m_i$$

IMPROVEMENT: COMMON SOLUTION
IS CALCULATED ACROSS NSA $$
\begin{pmatrix} S_1 \\ S_2 \\ S_3 \\ S_4 \end{pmatrix}
=
\begin{pmatrix} B_1 \\ B_2 \\ B_3 \\ B_4 \end{pmatrix}
m
$$

$$m = (B_{all}^H \Sigma^{-1} B_{all})^{-1} B_{all}^H \Sigma^{-1} S_{all}$$

G-FACTOR MAPS OF ALL SLICES

CONVENTIONAL

FIRST AXIS

SECOND AXIS

THIRD AXIS

COMMON SOLUTION

FIRST AXIS

SECOND AXIS

THIRD AXIS

FIG. 12

MAGNETIC RESONANCE IMAGING SYSTEM AND OPERATION METHOD OF MAGNETIC RESONANCE IMAGING SYSTEM

CROSS-REFERENCE TO RELATED APPLICATION

The present application claims priority under 35 U.S.C § 119 (a) to Japanese Patent Application No. 2023-098414 filed on Jun. 15, 2023, which is hereby expressly incorporated by reference, in its entirety, into the present application.

BACKGROUND OF THE INVENTION

1. Field of the Invention

The present invention relates to a magnetic resonance imaging system and an operation method of a magnetic resonance imaging system, and more particularly, to a technique of improving image quality of an image to be reconstructed from a nuclear magnetic resonance signal.

2. Description of the Related Art

One imaging method using a magnetic resonance imaging apparatus (MRI apparatus) is a diffusion weighted image (DWI).

The DWI is an image obtained by applying a strong gradient magnetic field called a motion probing gradient pulse (MPG pulse) in a plurality of directions (to axes), measuring echo signals, and visualizing a degree of diffusion of water molecules based on differences in influences caused by the MPG pulse, and is useful for diagnosing an infarction or a tumor in which diffusion restriction occurs. In the DWI, echo planar imaging (EPI), which is one of fast imaging methods, is often used.

EPI includes single-shot EPI and multi-shot EPI.

The single-shot EPI is a method of repeating the inversion of the gradient magnetic field during excitation by a single RF pulse to create a plurality of gradient echoes, and filling a k-space with data necessary for image reconstruction. In addition, the multi-shot EPI is a method of filling the k-space with data of an echo train obtained in a plurality of shots.

The single-shot EPI has an advantage in that a signal can be acquired at a high speed because data of the k-space (Fourier space) in which a nuclear magnetic resonance signal (NMR signal) is disposed can be acquired in a single excitation. However, there are also problems such as occurrence of N/2 artifacts due to an error in application of the gradient magnetic field in a case of acquiring the NMR signal as the echo signal while inverting the readout gradient magnetic field, and susceptibility to distortion and positional shifts in a phase-encoding direction due to static magnetic field inhomogeneity and the like.

The multi-shot EPI has an advantage in that susceptibility artifacts are reduced because it can take more time to collect all the data as compared with the single-shot EPI, resulting in less burden on a gradient magnetic field system and no accumulation of phase errors. On the other hand, the multi-shot EPI has a disadvantage in that it takes longer time for imaging and is susceptible to movement artifacts.

JP2023-32832A describes a magnetic resonance imaging apparatus that repeats a DWI sequence, collects a plurality of pieces of measurement data (k-space data) consisting of the necessary number of echo signals for one image for the same subject, weights and adds the plurality of pieces of measurement data (a plurality of images), and reconstructs one image.

JP2019-503750A describes that echo signals are acquired in three different directions by a multi-shot EPI sequence. In addition, it is described that a complete k-space echo signal data set is acquired through four shots, and the echo signals are acquired by using signal averaging in order to further improve a signal-to-noise ratio (SNR). The number of signal average (NSA) is set to three, and three signal averaging steps are used.

SUMMARY OF THE INVENTION

JP2023-32832A and JP2019-503750A describe that, in order to improve the SNR, a plurality of imaging operations are performed and a plurality of images obtained as a result of the plurality of imaging operations are added (weighted-addition, arithmetic mean), but have a problem in that it cannot sufficiently improve the SNR and a G-factor due to a body motion of a subject for each imaging in the addition of the plurality of images.

The present invention has been made in view of such circumstances, and an object of the present invention is to provide a magnetic resonance imaging system and an operation method of a magnetic resonance imaging system capable of improving image quality of an image to be reconstructed.

According to the invention of a first aspect, there is provided a magnetic resonance imaging system comprising: a magnetic resonance imaging apparatus; a processor; and at least one memory, in which the processor is configured to: use the magnetic resonance imaging apparatus to perform a plurality of imaging operations on the same slice of a subject in accordance with an imaging sequence; collect pieces of measurement data indicating nuclear magnetic resonance signals in correspondence with the plurality of imaging operations from the magnetic resonance imaging apparatus; acquire a common solution to be used in a case of generating a single final image in a real space from the pieces of measurement data collected in the plurality of imaging operations; and generate the final image by using the pieces of measurement data collected in the plurality of imaging operations and the common solution.

According to the first aspect of the present invention, in a case of generating the single final image in the real space from the pieces of measurement data obtained by performing the plurality of imaging operations on the same slice of the subject, the final image is generated using the common solution, so that a signal-to-noise ratio of the final image can be improved.

In the magnetic resonance imaging system according to a second aspect of the present invention, in the first aspect, it is preferable that the imaging sequence is a multi-shot sequence or a single-shot sequence, and the multi-shot sequence or the single-shot sequence is executed a plurality of times. In addition, it is preferable that the multi-shot sequence or the single-shot sequence is a multi-shot EPI sequence or a single-shot EPI sequence.

In the magnetic resonance imaging system according to a third aspect of the present invention, in the first or second aspect, it is preferable that the processor is configured to generate a diffusion weighted image as the final image.

In the magnetic resonance imaging system according to a fourth aspect of the present invention, in any one of the first to third aspects, it is preferable that the magnetic resonance imaging apparatus includes a reception coil consisting of multiple-array coils of $N_{ch}$ channels, the processor is configured to, in a case where the number of shots in the imaging sequence is denoted by $N_{sh}$, collect $N_{ch} \times N_{sh}$ pieces of measurement data through a single imaging operation, and a determinant, where $N_{ch} \times N_{sh}$ sheets of intermediate images in the real space, which are obtained by inverse Fourier transforming the $N_{ch} \times N_{sh}$ pieces of measurement data, for each of N imaging operations where N represents the number of the plurality of imaging operations are denoted by $S_i$ (i=1 to N) and the final image is denoted by m, is represented by [Equation 1].

$$[S_i] = [B_i]\, m \qquad \text{[Equation 1]}$$

(Here, $B_i$ represents a matrix $B_i$ (i=1 to N) including a coil sensitivity matrix.)

In this case, it is preferable that the common solution calculated by [Equation 1], which is denoted by D, is represented by [Equation 2].

$$D = \left( B_{all}^{H} \sum{}^{-1} B_{all} \right)^{-1} B_{all}^{H} \sum{}^{-1} \qquad \text{[Equation 2]}$$

(Here, $B_{all}$ represents the matrix $B_i$ (i=1 to N), and $\Sigma$ represents a noise correlation matrix between the $N_{ch}$ channels of the reception coil.)

It is preferable that the processor is configured to: generate the $N_{ch} \times N_{sh}$ sheets of intermediate images $S_i$ by inverse Fourier transforming the $N_{ch} \times N_{sh}$ pieces of measurement data; and generate the final image m based on the common solution D and intermediate images $S_{all}$, which are all the intermediate images $S_i$ generated for each of the N imaging operations, by using [Equation 3].

$$m = DS_{all} \qquad \text{[Equation 3]}$$

In the magnetic resonance imaging system according to a fifth aspect of the present invention, in the fourth aspect, it is preferable that the imaging sequence is a multi-shot sequence, in a case where the number of shots of the multi-shot sequence is denoted by $N_{sh}$, and a reduction factor of a parallel imaging method is denoted by R, the pieces of measurement data, which are disposed by the number of lines thinned out to 1/R in a phase-encoding direction of a k-space, are thinned out to $1/(N_{sh} \times R)$ in the phase-encoding direction and are collected in $N_{sh}$ separate shots, the matrix $B_i$ includes a coil sensitivity matrix of the reception coil consisting of the $N_{ch}$ channels, a phase shift matrix indicating a phase shift corresponding to a k-space disposition error of the pieces of measurement data collected in the $N_{sh}$ separate shots, and a phase variation matrix indicating a phase variation caused by a body motion of the subject between the pieces of measurement data collected in the $N_{sh}$ separate shots, and the processor is configured to calculate the common solution D based on the coil sensitivity matrix, the phase shift matrix, the phase variation matrix, and the noise correlation matrix between the $N_{ch}$ channels of the reception coil.

In the magnetic resonance imaging system according to a sixth aspect of the present invention, in the fifth aspect, it is preferable that the multi-shot sequence includes a main scan and a navigator scan for acquiring a main echo signal and a navigator echo signal as the pieces of measurement data, the memory is configured to store the coil sensitivity matrix, the phase shift matrix, and the noise correlation matrix, and the processor is configured to acquire the coil sensitivity matrix, the phase shift matrix, and the noise correlation matrix from the memory and calculate the phase variation matrix based on the navigator echo signals of the $N_{sh}$ shots.

That is, the coil sensitivity matrix, the phase shift matrix, and the noise correlation matrix are matrices that can be measured in advance, can be stored in the memory, and are read out from the memory in a case of calculating the common solution D. On the other hand, the phase variation matrix is a matrix indicating a phase variation caused by the body motion of the subject between the pieces of measurement data collected in $N_{sh}$ separate shots. Therefore, the processor calculates the phase variation matrix based on the navigator echo signals acquired together with the main echo signals of the $N_{sh}$ shots.

In the magnetic resonance imaging system according to a seventh aspect of the present invention, in any one of the first to third aspects, it is preferable that the magnetic resonance imaging apparatus includes a reception coil consisting of multiple-array coils of $N_{ch}$ channels, the processor is configured to, in a case where the number of shots in the imaging sequence is denoted by $N_{sh}$, collect $N_{ch} \times N_{sh}$ pieces of measurement data through a single imaging operation, and a determinant, where $N_{ch} \times N_{sh}$ sheets of intermediate images in the real space, which are obtained by inverse Fourier transforming the $N_{ch} \times N_{sh}$ pieces of measurement data, for each of N imaging operations where N represents the number of the plurality of imaging operations are denoted by $S_i$ (i=1 to N) and the final image is denoted by m, is represented by [Equation 1].

$$[S_i] = [B_i]\, m \qquad \text{[Equation 1]}$$

(Here, $B_i$ represents a matrix $B_i$ (i=1 to N) including a coil sensitivity matrix.)

In this case, it is preferable that the common solution calculated by [Equation 1], which is denoted by D, is represented by [Equation 2].

$$D = \left( B_{all}^{H} B_{all} \right)^{-1} B_{all}^{H} \qquad \text{[Equation 2]}$$

(Here, $B_{all}$ represents the matrix $B_i$ (i=1 to N).)

It is preferable that the processor is configured to: generate the $N_{ch} \times N_{sh}$ sheets of intermediate images $S_i$ by inverse Fourier transforming the $N_{ch} \times N_{sh}$ pieces of measurement data; and generate the final image m based on the common solution D and intermediate images $S_{all}$, which are all the intermediate images $S_i$ generated for each of the N imaging operations, by using [Equation 3].

$$m = DS_{all} \qquad \text{[Equation 3]}$$

In the magnetic resonance imaging system according to an eighth aspect of the present invention, in the seventh aspect, it is preferable that the imaging sequence is a multi-shot sequence, in a case where the number of shots of the multi-shot sequence is denoted by $N_{sh}$, and a reduction factor of a parallel imaging method is denoted by R, the pieces of measurement data, which are disposed by the number of lines thinned out to 1/R in a phase-encoding direction of a k-space, are thinned out to $1/(N_{sh} \times R)$ in the phase-encoding direction and are collected in $N_{sh}$ separate shots, the matrix $B_i$ includes a coil sensitivity matrix of the reception coil consisting of the $N_{ch}$ channels, a phase shift matrix indicating a phase shift corresponding to a k-space disposition error of the pieces of measurement data collected in the $N_{sh}$ separate shots, and a phase variation matrix indicating a phase variation caused by a body motion of the subject between the pieces of measurement data collected in the $N_{sh}$ separate shots, and the processor is configured to calculate the common solution D based on the coil sensitivity matrix, the phase shift matrix, the phase variation matrix, and the noise correlation matrix between the $N_{ch}$ channels of the reception coil.

In the magnetic resonance imaging system according to a ninth aspect of the present invention, in the eighth aspect, it is preferable that the multi-shot sequence includes a main scan and a navigator scan for acquiring a main echo signal and a navigator echo signal as the pieces of measurement data, the memory is configured to store the coil sensitivity matrix, the phase shift matrix, and the noise correlation matrix, and the processor is configured to acquire the coil sensitivity matrix, the phase shift matrix, and the noise correlation matrix from the memory and calculate the phase variation matrix based on the navigator echo signals of the $N_{sh}$ shots.

In the magnetic resonance imaging system according to a tenth aspect of the present invention, in the fourth or seventh aspect, it is preferable that the imaging sequence is a single-shot sequence to which a parallel imaging method is applied, the memory is configured to store the common solution D, and the processor is configured to acquire the common solution D from the memory. In a case of the single-shot sequence, since the common solution D remains unchanged, the common solution D can be calculated in advance and stored in the memory, and the processor can read out and use the common solution D from the memory in a case of generating the final image from the intermediate images $S_{all}$.

According to the invention of an eleventh aspect, there is provided an operation method of a magnetic resonance imaging system including a magnetic resonance imaging apparatus, a processor, and at least one memory, the operation method comprising: a step of, through the processor, using the magnetic resonance imaging apparatus to perform a plurality of imaging operations on the same slice of a subject in accordance with an imaging sequence; a step of, through the processor, collecting pieces of measurement data indicating nuclear magnetic resonance signals in correspondence with the plurality of imaging operations from the magnetic resonance imaging apparatus; a step of, through the processor, acquiring a common solution to be used in a case of generating a single final image in a real space from the pieces of measurement data collected in the plurality of imaging operations; and a step of, through the processor, generating the final image by using the pieces of measurement data collected in the plurality of imaging operations and the common solution.

According to the present invention, since a single common solution common to a case of generating a single final image in a real space from the pieces of measurement data collected by performing the plurality of imaging operations on the same slice of the subject is acquired, and the final image is generated by using the pieces of measurement data collected in the plurality of imaging operations and the common solution, it is possible to improve a signal-to-noise ratio of the final image, and it is possible to improve image quality of the final image.

BRIEF DESCRIPTION OF THE DRAWINGS

FIG. 2 is a diagram showing an example of a multi-shot EPI sequence.

FIG. 12 is a diagram showing an example of a single-shot EPI sequence.

DESCRIPTION OF THE PREFERRED EMBODIMENTS

Hereinafter, preferred embodiments of a magnetic resonance imaging system and an operation method of a magnetic resonance imaging system according to the present invention will be described with reference to the accompanying drawings.

Configuration of Magnetic Resonance Imaging System

Figure 1:
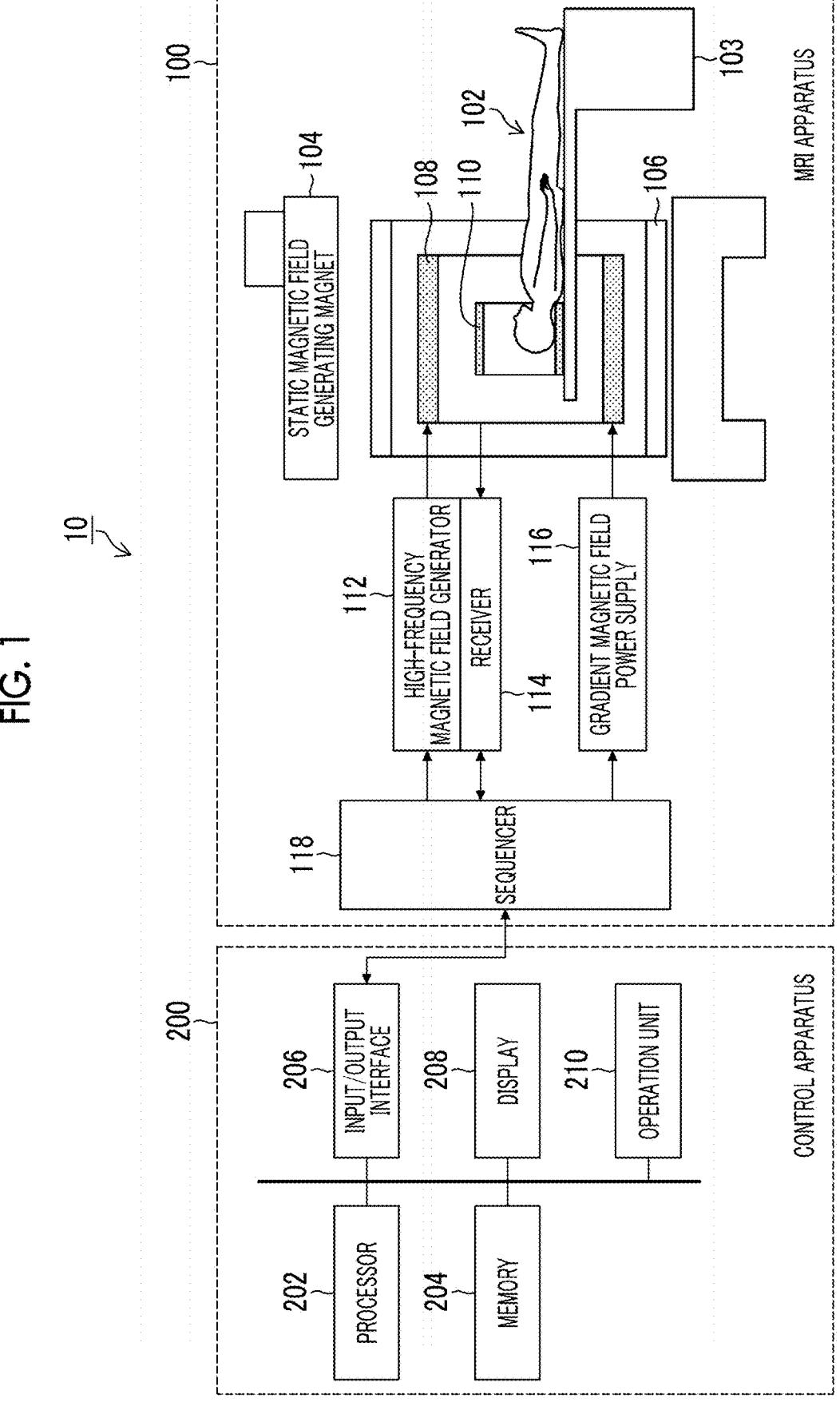
FIG. 1 is a diagram showing a schematic configuration of a magnetic resonance imaging system according to an embodiment of the present invention.

FIG. 1 is a diagram showing a schematic configuration of a magnetic resonance imaging system according to the embodiment of the present invention.

As shown in FIG. 1, a magnetic resonance imaging system 10 includes a magnetic resonance imaging apparatus (MRI apparatus) 100 and a control apparatus 200.

The MRI apparatus 100 shown in FIG. 1 comprises a static magnetic field generating magnet 104 that generates a uniform static magnetic field in an imaging space in which a subject 102 is disposed, a gradient magnetic field coil 106 that generates a gradient magnetic field in the imaging space, a radio frequency (RF) coil (transmission coil) 108 that generates a high-frequency magnetic field for inducing a nuclear magnetic resonance signal (NMR signal) from atomic nuclei constituting tissues of the subject 102, and an RF probe (reception coil) 110 that detects the NMR signal generated from the subject 102. The subject 102 is usually disposed in the imaging space in a state of lying on a bed 103.

A sequencer 118 sends commands to a high-frequency magnetic field generator 112 and a gradient magnetic field power supply 116 in accordance with an imaging sequence (pulse sequence) to generate the high-frequency magnetic field and the gradient magnetic field, respectively. The generated high-frequency magnetic field is applied to the subject 102 as a pulsed high-frequency magnetic field (RF pulse) through the transmission coil 108. The NMR signal generated from the subject 102 is received by the reception coil 110 and is demodulated by a receiver 114. Since the NMR signal, which is usually generated as a gradient echo or a spin echo, is collected, the NMR signal is referred to as an echo signal here.

The gradient magnetic field coil 106 is configured with gradient magnetic field coils in three directions, X, Y, and Z, and each of the gradient magnetic field coils generates a gradient magnetic field in response to a signal from the gradient magnetic field power supply 116. In addition, the reception coil 110 of the present example is configured with multiple-array coils of M channels, where M is an integer of 2 or more.

A nuclear magnetic resonance frequency (demodulation reference frequency f0) to be used as a reference for demodulation in the receiver 114 is set by the sequencer 118. The sequencer 118 controls each unit to operate at a pre-programmed timing and intensity. Among programs, a program that particularly describes the timing and intensity of RF pulses, gradient magnetic fields, and signal reception is referred to as a pulse sequence.

Various pulse sequences are known depending on the purpose, but in the present embodiment, a multi-shot sequence for collecting an echo signal for image generation by using two or more excitation RF pulses is employed, and a multi-shot EPI sequence for performing imaging particularly by using an EPI method is employed. In addition, an MPG pulse is used in order to obtain a diffusion weighted image.

Figure 2:
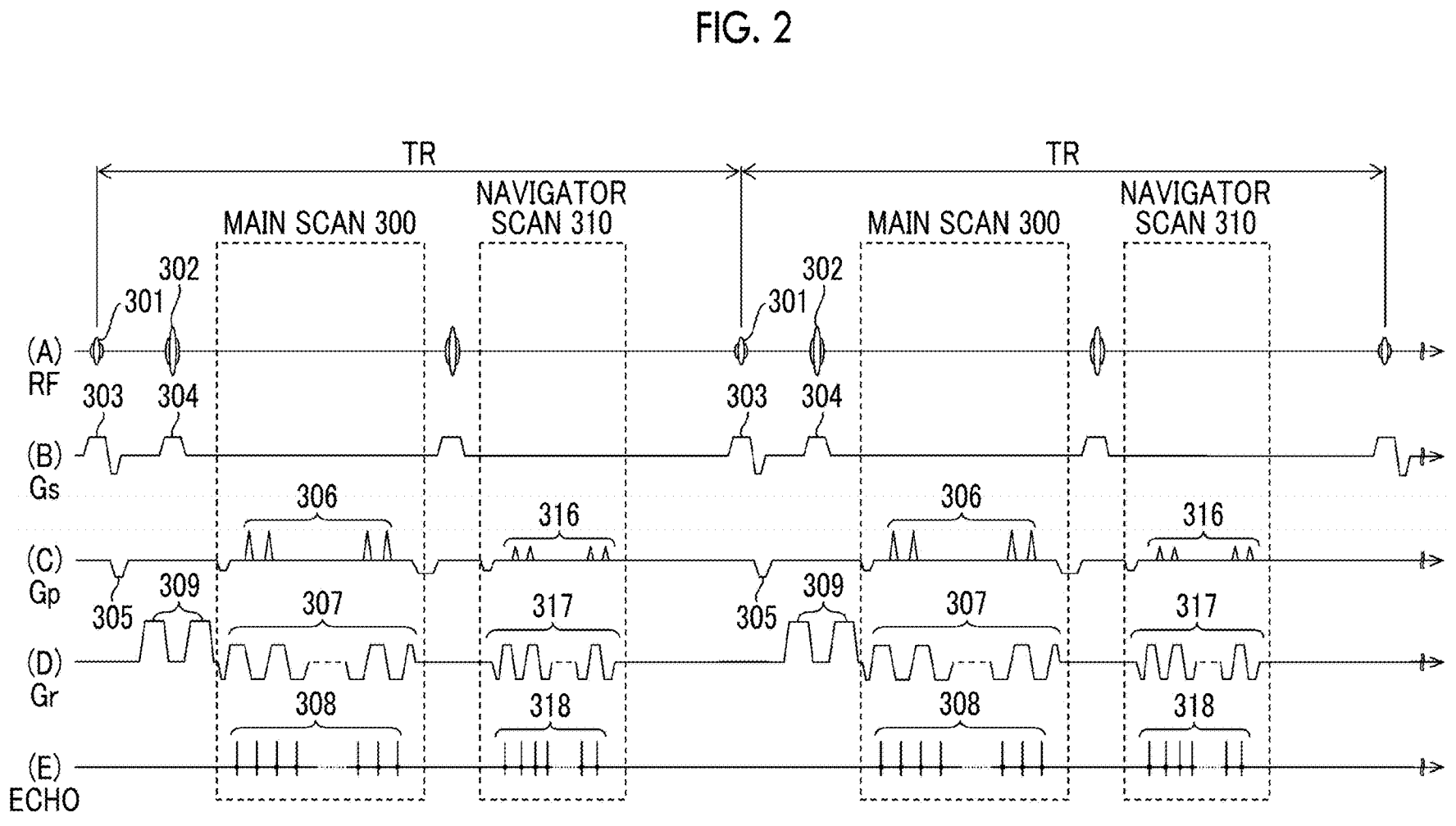

FIG. 2 is a diagram showing an example of the multi-shot EPI sequence.

(A) of FIG. 2 shows an application timing of the RF pulse, (B), (C), and (D) of FIG. 2 show application timings of the gradient magnetic field pulses in a slice direction, a phase-encoding direction, and a readout direction, respectively, and (E) of FIG. 2 shows an acquisition timing of the echo signal (a main echo signal and a navigator echo signal).

As shown in FIG. 2, in the multi-shot EPI sequence, a slice selection gradient magnetic field 303 and an excitation RF pulse 301 are applied, and then an inversion RF pulse 302 is applied together with a slice selection gradient magnetic field 304 to excite a desired slice. An MPG pulse 309 having a large intensity is applied before and after this inversion RF pulse 302. Subsequently, a phase-encoding gradient magnetic field 305 is applied, and then a blipped phase-encoding gradient magnetic field 306 and a readout gradient magnetic field 307 with inverted polarity are continuously applied, and a main echo signal 308 is collected during the application of the inverting readout gradient magnetic field 307. A main scan 300 of collecting the main echo signal 308 in this manner is performed.

A navigator scan 310 is performed after the main scan 300.

In the navigator scan 310, the polarity of a phase-encoding gradient magnetic field 316 is set to the same polarity as the phase-encoding gradient magnetic field 306 of the main scan 300, and a navigator echo signal 318 is collected for each inversion of a readout gradient magnetic field 317. The number and the range of the navigator echo signals 318 to be collected need only ensure that an image having the same field of view (FOV) as the FOV of the main scan image is obtained as a navigator scan image to be reconstructed, and the number and the range thereof are not particularly limited, but the phase-encoding gradient magnetic field 316 is set to have a lower application intensity than that of the main scan 300, and data in the vicinity of the center (low-frequency region) of a k-space is collected.

In addition, in the multi-shot EPI sequence, repetitive excitation RF pulses are generated at time intervals of a time to repeat (TR), and the main echo signals 308 and the navigator echo signals 318 are collected and disposed in the k-space.

Figures 3A, 3B:
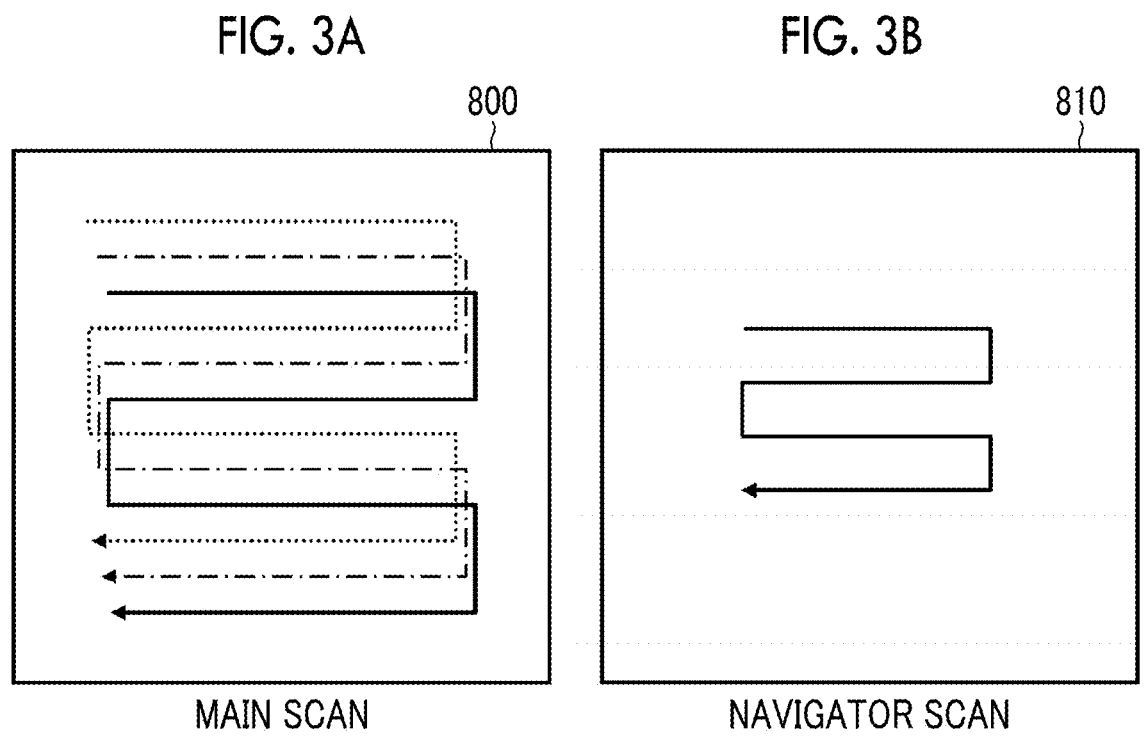
FIGS. 3A and 3B are diagrams showing an example of k-space data obtained by a main scan and a navigator scan.

FIGS. 3A and 3B are diagrams showing an example of k-space data obtained by the main scan and the navigator scan.

Since the main scan 300 and the navigator scan 310 of the present example collect the echo signals with the same polarity of the phase encoding gradient magnetic field, the k-space is scanned from top to bottom in each of the main scan and the navigator scan as shown in FIGS. 3A and 3B.

In addition, in the multi-shot EPI sequence, the main echo signals are collected such that the phase-encoding direction of the main echo signal to be collected for each shot is shifted (such that the main echo signals are disposed in different regions in the k-space).

The k-space shown in FIG. 3A shows a case where the number of shots in the multi-shot EPI sequence is three, and the main echo signals to be collected for each shot are disposed on different trajectories in the k-space.

The number of shots (the number of generated echoes) in the multi-shot EPI sequence is about 2 to 10, and the TR is about 1000 ms to 7000 ms. Diffusion-weighted imaging in a multi-shot sequence, in which an echo signal necessary for one image is divided and acquired, is advantageous for improving spatial resolution.

In a diffusion weighted image (DWI) captured and reconstructed by a single multi-shot EPI sequence, a plurality of imaging operations are performed on the same slice of the subject because the SNR is low. In addition, the MPG pulse is applied to each direction of the three orthogonal axes (first axis, second axis, and third axis) to acquire the DWI corresponding to each axis.

Returning to FIG. 1, the control apparatus 200 controls the operation of the MRI apparatus 100 via the sequencer 118 described above, and receives the signals demodulated by the MRI apparatus 100 (receiver 114) (the main echo signal by the main scan and the navigator echo signal by the navigator scan) and performs various types of signal processing such as image reconstruction. The receiver 114 quadrature-phase demodulates the echo signal, which is an analog wave, with the set demodulation reference frequency f0, converts the echo signal into complex numbers of raw data consisting of a real part and an imaginary part, and then transmits the raw data to the control apparatus 200. In the present example, the raw data is also referred to as the echo signal or the measurement data.

The control apparatus 200 can be configured by using a computer. The computer to be applied to the control apparatus 200 may be a personal computer or a workstation.

The control apparatus 200 comprises a processor 202, a memory 204, an input/output interface 206, a display 208, an operation unit 210, and the like as hardware.

The processor 202 is configured with a central processing unit (CPU) or the like, and integrally controls each unit of the control apparatus 200 and the MRI apparatus 100 and implements various functions to be described below by executing various programs stored in the memory 204.

The memory 204 is one or more memories including a flash memory, a read-only memory (ROM), a random access memory (RAM), a hard disk device, and the like. The flash memory, the ROM, and the hard disk device are non-volatile memories that store an operation system, a program for causing the processor 202 to function as the control apparatus 200, various pulse sequences, calculation expressions to be used for image reconstruction, parameters, reconstructed MRI images, and the like.

The RAM functions as a work area for processing by the processor 202 and temporarily stores the programs and the like stored in the non-volatile memory. In addition, the RAM functions as a place (k-space) for temporarily storing the echo signal (raw data). The processor 202 may incorporate a part (RAM) of the memory 204.

The input/output interface 206 includes a communication unit that can be connected to a network, a connection unit that can be connected to an external device, and the like. A universal serial bus (USB), a high-definition multimedia interface (HDMI) (HDMI is a registered trademark), or the like can be applied as the connection unit that can be connected to the external device.

The processor 202 communicates with the device (in the present example, the sequencer 118) disposed in the MRI apparatus 100 via the input/output interface 206, thereby transmitting and receiving necessary information. A part of the sequencer 118 may be provided on a control apparatus 200 side.

The display 208 is used as a part of a graphical user interface (GUI) in a case of receiving the MRI image and the input from the operation unit 210.

The operation unit 210 includes a mouse, a keyboard, and the like, and functions as a part of a GUI that receives an input from an operator by using a display operation window of the display 208.

That is, the operation unit 210 and the display 208 function as a GUI for the operator to activate and stop (temporarily stop) the MRI apparatus 100, select the pulse sequence, or input imaging conditions, processing conditions, and the like.

Figure 4:
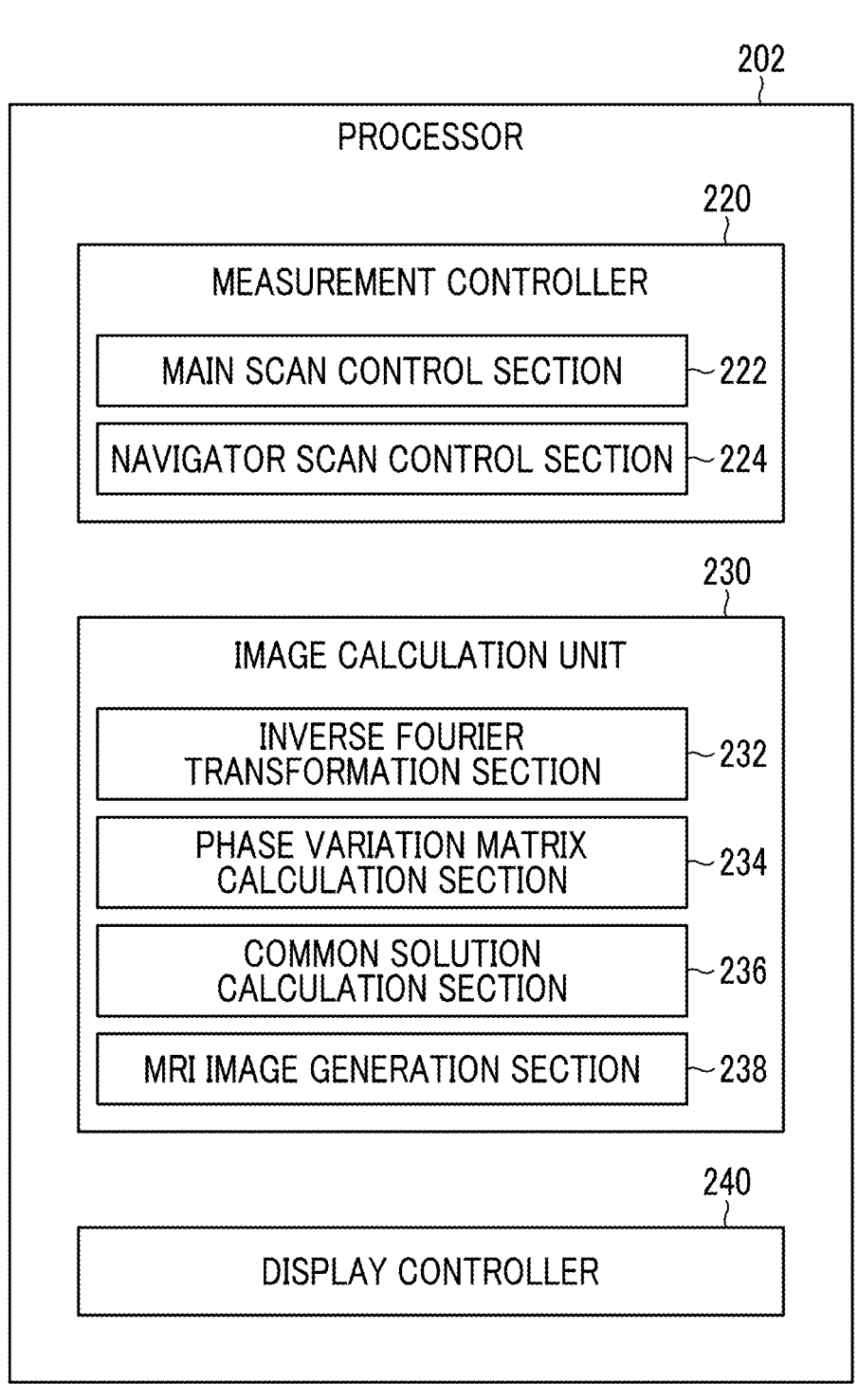
FIG. 4 is a functional block diagram showing a function of a processor of a control apparatus shown in FIG. 1.

FIG. 4 is a functional block diagram showing a function of the processor of the control apparatus shown in FIG. 1.

As shown in FIG. 4, the processor 202 executes various programs stored in the memory 204 to function as a measurement controller 220, an image calculation unit 230, and a display controller 240.

The measurement controller 220 includes a main scan control section 222 and a navigator scan control section 224, and sends a predetermined pulse sequence, imaging conditions (imaging parameters) designated by the operator, and the like to the sequencer 118 (FIG. 1) of the MRI apparatus 100 to control the MRI apparatus 100 via the sequencer 118. In the present example, the multi-shot EPI sequence shown in FIG. 2 and the like is selected as the predetermined pulse sequence.

The main scan control section 222 and the navigator scan control section 224 send commands to the sequencer 118 in accordance with the set conditions. Under the control of the sequencer 118, the MRI apparatus 100 executes the multi-shot EPI sequence, collects the main echo signal by the main scan and the navigator echo signal by the navigator scan, and disposes the main echo signal and the navigator echo signal in the corresponding k-spaces, respectively.

The image calculation unit 230 includes an inverse Fourier transformation section 232, a phase variation matrix calculation section 234, a common solution calculation section 236, an MRI image generation section 238, and the like.

The inverse Fourier transformation section 232 is a section that performs an inverse Fourier transformation on the echo signal in a spatial frequency region disposed in the k-space to convert the echo signal into an image in the real space.

One of the issues of the DWI generated by the multi-shot EPI is that, due to the influence of a pair of large gradient magnetic fields (MPG) given for each shot, the phase is different (phase discrepancies occur) for each shot in a portion of the subject having movement.

The phase variation matrix calculation section 234 is a section that calculates the phase variation matrix based on the navigator echo signals of each shot, and calculates information (phase variation matrix) indicating the variation in the image between the shots based on the navigator scan image reconstructed from the navigator echo signals. This phase variation matrix is used to correct discrepancies between images reconstructed from the main echo signals of each shot, which is caused by the body motion of the subject between the shots.

In the DWI, a plurality of imaging operations are performed on the same slice of the subject because the SNR is low. Conventionally, a plurality of intermediate images are generated through a plurality of imaging operations, and arithmetic mean is performed on the generated plurality of intermediate images to improve the SNR of a single final image (DWI) to be finally generated. In the generation of each intermediate image, an individual correction solution (matrix) is calculated for each intermediate image, and the corresponding intermediate image is corrected by using the calculated individual solution.

The common solution calculation section 236 is a section that calculates a common solution to be used in a case of generating a single final image (DWI) in the real space from the pieces of measurement data (echo signals) collected in correspondence with the plurality of imaging operations, without calculating the individual correction solution as in the related art.

The MRI image generation section 238 is a section that generates a single final image (DWI) by using the echo signals collected in the plurality of imaging operations and the common solution calculated by the common solution calculation section 236.

Details of the calculation processing by the common solution calculation section 236 and the MRI image generation section 238 will be described below.

In addition, the DWI has an issue that distortion or blurring is likely to occur in the image. This is due to EPI-specific problems such as susceptibility to static magnetic field inhomogeneity and the changing direction of the readout gradient magnetic field for each echo in the EPI.

The image calculation unit 230 includes a displacement amount calculation section (not shown) and a distortion correction section (not shown). The distortion occurring in the main scan image and the navigator scan image, due to accumulated phase errors caused by the static magnetic field inhomogeneity, is distortion in the same direction because the phase encoding polarities applied to the main echo signal and the navigator echo signal are the same. The displacement amount calculation section calculates a displacement amount (the displacement amount in the real space) to be used for the distortion correction by using the navigator scan image. A distortion correction section 223 performs the distortion correction of the main scan image by using the displacement amount.

The display controller 240 displays the DWI calculated by the image calculation unit 230 or the MRI image captured and reconstructed by the pulse sequence other than the multi-shot EPI sequence, and necessary accessory information (for example, information regarding imaging conditions, the subject, or the like) on the display 208 (FIG. 1). In addition, the processor 202 stores the DWI or the like with the accessory information in the memory 204.

The above-described functions of the processor 202 are implemented by the CPU or the GPU executing pre-designed programs. A part of the functions of the processor 202 may be implemented by hardware such as an application specific integrated circuit (ASIC) or a field programmable gate array (FPGA).

Principle of the Present Invention

Next, the principle of the present invention related to the calculation processing by the common solution calculation section 236 and the MRI image generation section 238 shown in FIG. 4 will be described.

In the examples shown below, the number of shots ($N_{sh}$) in the multi-shot EPI sequence is set to two.

In addition, in the present example, a parallel imaging method is used. The parallel imaging method is a technique of using a plurality of coils (multiple-array coils) to enable imaging in a short time by thinning out the phase encoding. Parallel imaging includes a sensitivity encoding (SENSE) system that performs unfolding processing in a real space and a simultaneous acquisition of spatial harmonics (SMASH) system that performs unfolding processing in a k-space. In the present example, the SENSE system is used as the parallel imaging, and the reduction factor R indicating the thinning-out rate of the parallel imaging method is set to 2.

By setting the number of shots $N_{sh}$ in the multi-shot EPI sequence to two and setting the reduction factor R of the parallel imaging method to 2, the pieces of measurement data thinned out to ½ in the phase-encoding direction of the k-space are thinned out to ¼ ($1/(N_{sh}×R)$) in the phase-encoding direction and are collected in two separate shots ($N_{sh}$).

The reception coil 110 of the present example is configured with multiple-array coils of $N_{ch}$ channels, and specifically, is configured with multiple-array coils of six channels ($N_{ch}=6$).

In a case where the number of shots $N_{sh}$ of the multi-shot EPI sequence is set to two (sh1 and sh2) and a single multi-shot EPI sequence is executed, echo signals corresponding to 12 images (that is, images of the number of channels $N_{ch}$ ($N_{ch}=6$) of the reception coil 110×the number of shots $N_{sh}$ ($N_{sh}=2$)) are collected.

Then, by performing inverse Fourier transformation on each of the echo signals corresponding to the 12 images, it is possible to generate the 12 images in the real space.

Since the echo signals collected by each coil of each channel are thinned out to ¼ in the phase-encoding direction of the k-space, the scan time is shortened, and the imaging speed per image can be increased.

On the other hand, the FOV of each image decreases, and folding occurs. In the present example, since the echo signals corresponding to each image are thinned out to ¼ in the phase-encoding direction of the k-space, the image generated by the inverse Fourier transformation is an image with folding (folded image), and the FOV is ¼. Here, in a case where the size of the FOV without folding is set to 256 pixels×256 pixels, the size of the FOV of the folded image is 256 pixels×64 pixels.

The image without folding can be acquired by using a sensitivity map for each coil of the reception coil 110 to perform unfolding processing on the folded image.

Figure 5:
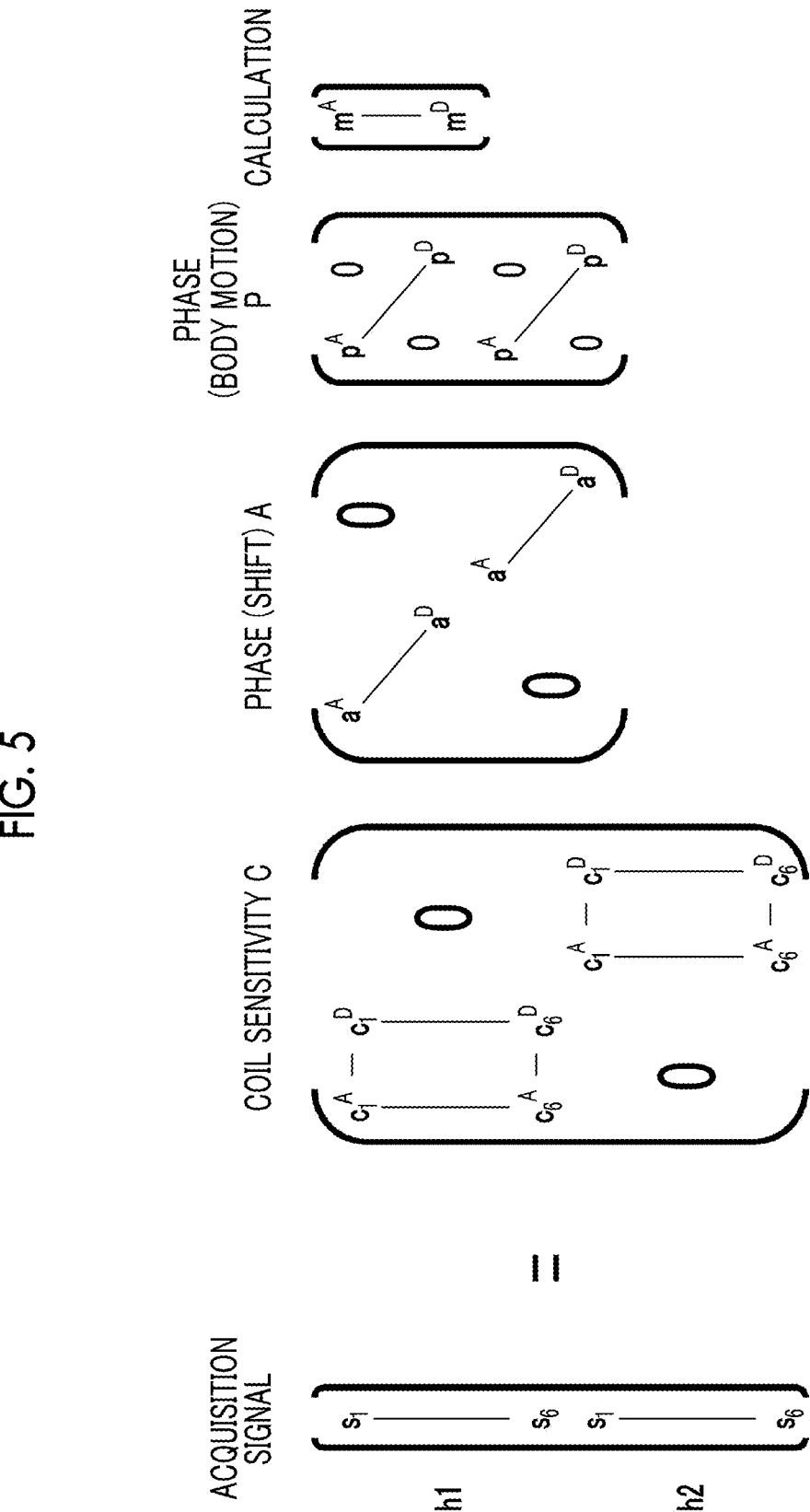
FIG. 5 is a diagram representing a relationship between a certain pixel within a main scan image acquired in a single imaging operation of the multi-shot EPI sequence and an unfolded pixel calculated from the certain pixel in a matrix representation.

FIG. 5 is a diagram representing a relationship between a certain pixel within the main scan image acquired in a single imaging operation of the multi-shot EPI sequence and an unfolded pixel calculated from the certain pixel in a matrix representation.

In FIG. 5, the left side of the equation represented in the matrix representation indicates 12 acquisition signals ($s_1$ to $s_6$ and $s_1$ to $s_6$), and the right side indicates a coil sensitivity matrix C, a phase shift matrix A, a phase variation matrix P, and signals m ($m^A$ to $m^D$) for four pixels corresponding to the acquisition signals ($s_1$ to $s_6$ and $s_1$ to $s_6$) in the image to be calculated through the unfolding processing. Here, the superscripts A to D of the signals m correspond to the number of shots $N_{sh}$×the reduction factor R, and in the present example, the number of shots $N_{sh}$×the reduction factor R is 4 ($=N_{sh}×R$).

The acquisition signals ($s_1$ to $s_6$ and $s_1$ to $s_6$) indicate the signals of the pixels at the same positions of the 12 folded images (256 pixels×64 pixels), which are obtained by performing inverse Fourier transformation on the echo signals acquired in six channels ($N_{ch}=6$) of the reception coil 110×two shots ($N_{sh}=2$).

The coil sensitivity matrix C is a matrix showing a sensitivity map ($c_1^A$ to $c_1^D$, $c_2^A$ to $c_2^D$, . . . , and $c_6^A$ to $c_6^D$) indicating the spatial sensitivity of each coil of the six channels. The sensitivity maps ($c_1^A$ to $c_1^D$, . . . , and $c_6^A$ to $c_6^D$) can be measured by executing the reference scan in advance and stored in the memory 204.

These sensitivity maps ($c_1^A$ to $c_1^D$, . . . , and $c_6^A$ to $c_6^D$) are used in a case of performing unfolding processing on the acquired folded images (in the present example, 12 folded images) corresponding to the respective coils to generate a single image without folding. In the present example, the signals m ($m^A$ to $m^D$) for four pixels on the image without folding corresponding to the acquisition signals ($s_1$ to $s_6$ and $s_1$ to $s_6$) can be calculated based on the 12 redundant acquisition signals ($s_1$ to $s_6$ and $s_1$ to $s_6$) exceeding the fold number and the sensitivity maps ($c_1^A$ to $c_1^D$, . . . , and $c_6^A$ to $c_6^D$) having different sensitivities for each coil.

Then, by calculating the signals m ($m^A$ to $m^D$) for four pixels for the acquisition signals ($s_1$ to $s_6$ and $s_1$ to $s_6$) for each pixel of all the pixels (256 pixels×64 pixels) in the folded images, a single image (256 pixels×256 pixels) without folding can be generated.

The pieces of measurement data thinned out to ½ in the phase-encoding direction of the k-space are collected in two separate shots ($N_{sh}$), but the phase shift matrix A ($a^A$ to $a^D$) shown in FIG. 5 is a matrix corresponding to k-space disposition errors of the two shots of pieces of measurement data filling the k-space. The phase shift matrix A can be calculated based on the navigator scan image to be reconstructed from the navigator echo signals corresponding to the two shots of pieces of measurement data (main echo signals) filling the k-space.

In FIG. 5, the phase variation matrix P ($p^A$ to $p^D$) is a matrix showing a phase variation caused by the body motion of the subject between the pieces of measurement data (echo signals) collected in two separate shots ($N_{sh}$). The phase variation matrix P can be calculated based on the navigator scan image to be reconstructed from the navigator echo signals corresponding to the two shots of main echo signals filling the k-space, in the same manner as the phase shift matrix A. Since the body motion of the subject is irregular, the phase variation matrix P is calculated by the phase variation matrix calculation section 234 each time the pieces of measurement data (echo signals) are collected in two separate shots ($N_{sh}$).

Here, in a case where the coil sensitivity matrix C, the phase shift matrix A, and the phase variation matrix P are represented by a matrix B=CAP, an intermediate image S in the matrix representation shown in FIG. 5 can be represented by the following determinant.

$$[S_i] = [B_i]m \qquad \text{[Equation 1]}$$

(Here, i represents a parameter indicating an imaging number of the plurality of imaging operations.)

In the conventional reconstruction method of the MRI image, a solution corresponding to [Equation 1] is calculated for each single imaging operation by the multi-shot EPI sequence, and an image m in which folding or the like is removed is calculated by the following equation.

$$m = \left(B^H \sum\nolimits^{-1} B\right)^{-1} B^H \sum\nolimits^{-1} S \qquad \text{[Equation 2]}$$

In [Equation 2], $\Sigma$ represents a noise correlation matrix between the plurality of channels of the reception coil.

In addition, in [Equation 2], m and S are as follows.
m=[$m_k$]: image (column vector) in which folding or the like is removed, where k is the pixel number.
S=[$S_{ij}$]: folded image acquired for each coil of $N_{ch} \times N_{sh}$, where i is the coil number in the shots sh1 and sh2, and j is the pixel number.

Figure 6:
FIG. 6 is a diagram representing a difference between a conventional reconstruction method and a reconstruction method according to the embodiment of the present invention using mathematical equations.

FIG. 6 is a diagram representing a difference between the conventional reconstruction method and the reconstruction method according to the embodiment of the present invention in equations. In FIG. 6, the same slice of the subject is imaged by the MRI apparatus 100 a plurality of times (four times in the present example) in accordance with the multi-shot EPI sequence.

The left side of FIG. 6 shows the above-described conventional reconstruction method, and in a case where the parameter indicating each imaging operation by the four multi-shot EPI sequences is denoted by i (i=1 to 4), an image mi for each imaging operation is calculated by the following equation.

$$m_i = \left(B_i^H \sum\nolimits^{-1} B_i\right)^{-1} B_i^H \sum\nolimits^{-1} S_i \qquad \text{[Equation 3]}$$

Arithmetic mean is performed on the calculated image mi as shown by the following equation.

$$m = (1/NSA)\sum\nolimits^i m_i \qquad \text{[Equation 4]}$$

Consequently, a single final image m is generated.

On the other hand, the reconstruction method according to the embodiment of the present invention is different from the conventional reconstruction method in that the 12 ($N_{ch} \times N_{sh}$) folded images (intermediate images) $S_i$ (i=1 to 4) are acquired by a single imaging operation as described above, but a single common solution with respect to all the intermediate images $S_1$ to $S_N$ (N=4) is calculated, without obtaining the solution of each individual intermediate image $S_i$ as in the related art.

That is, in a case where the common solution is denoted by D, the common solution Dis obtained by [Equation 5].

$$D = \left(B_{all}^H \sum\nolimits^{-1} B_{all}\right)^{-1} B_{all}^H \sum\nolimits^{-1} \qquad \text{[Equation 5]}$$

(Here, $B_{all}$ represents a matrix $B_i$ (i=1 to N).)

In a case where all the intermediate images are denoted by $S_{all}$, the final image m is generated based on the images $S_{all}$ and the common solution D by [Equation 6].

$$m = DS_{all} \qquad \text{[Equation 6]}$$

The common solution calculation section 236 shown in FIG. 4 calculates the common solution (matrix D) shown in [Equation 5] based on the coil sensitivity matrix C, the phase shift matrix A, and the noise correlation matrix 2, which are stored in the memory 204, and the phase variation matrix P calculated by the phase variation matrix calculation section 234, and the intermediate images $S_1$ to $S_N$.

Then, the MRI image generation section 238 shown in FIG. 4 generates a single final image (MRI image) m from the matrix D and the matrix $S_{all}$ by using [Equation 6].

In the above-described embodiment, the inverse matrix (2-1) of the noise correlation matrix (2) between the plurality of channels of the reception coil is used in a case of calculating the common solution D as shown in [Equation 5], but the present invention is not limited to this, and the common solution D may be calculated by using the following equation without using the noise correlation matrix (2).

$$D = \left(B_{all}^H B_{all}\right)^{-1} B_{all}^H \qquad \text{[Equation 7]}$$

COMPARATIVE EXAMPLE

Next, a comparative example will be described in which the MRI image generated by the conventional reconstruction method and the MRI image generated by the reconstruction method according to the embodiment of the present invention are compared.

Figure 7:
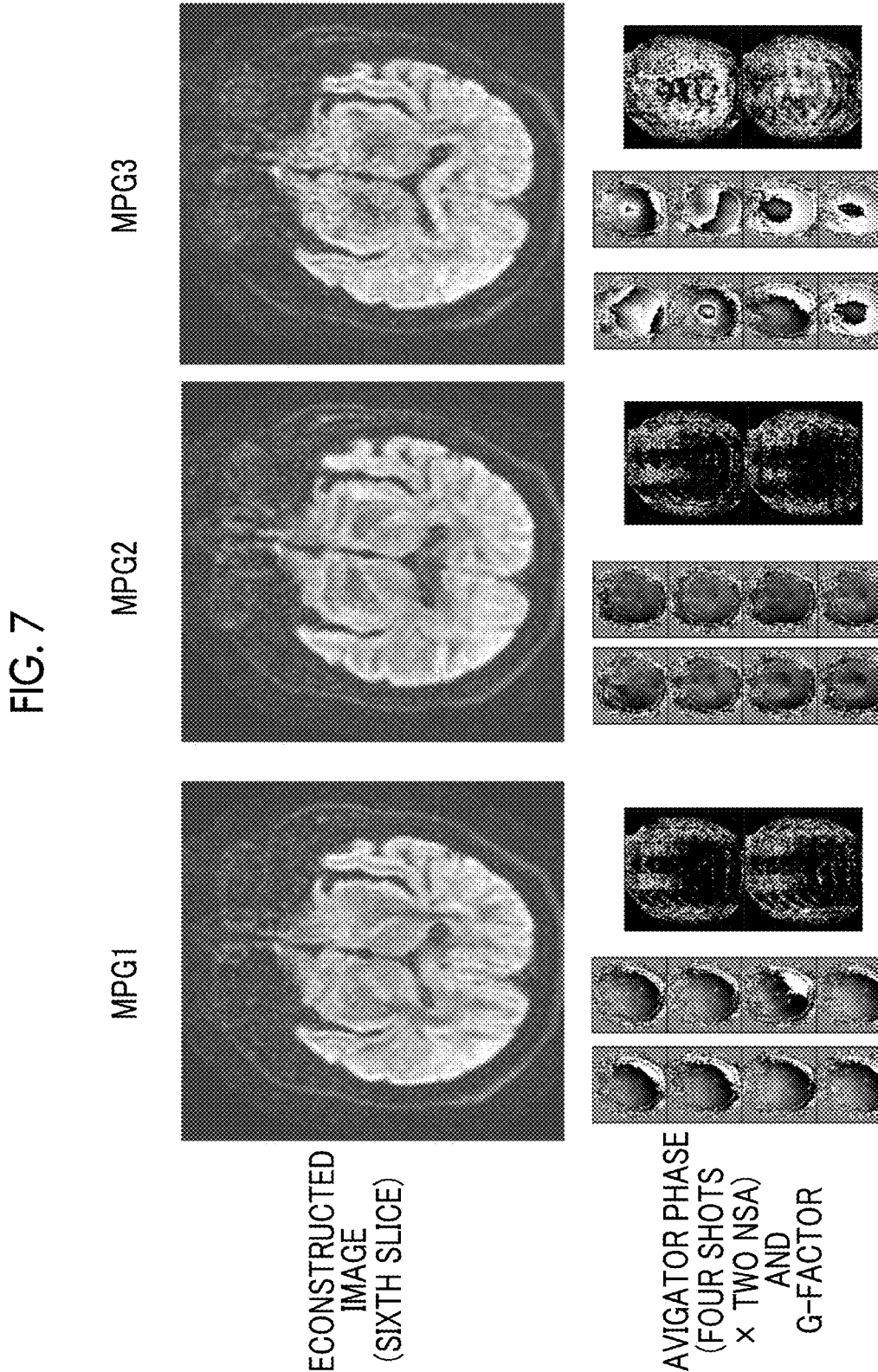
FIG. 7 is a view showing a reconstructed image, a G-factor, and the like generated by the conventional reconstruction method.

FIG. 7 is a view showing a reconstructed image (MRI image), a G-factor, and the like generated by the conventional reconstruction method.

In the example shown in FIG. 7, the number of shots by the multi-shot EPI sequence is four, and the number of imaging operations by the multi-shot EPI sequence is two.

Three reconstructed images MPG1, MPG2, and MPG3 shown in FIG. 7 are reconstructed images corresponding to three axes in which the application directions of the MPG pulses are different from each other. In addition, the three reconstructed images MPG1, MPG2, and MPG3 are images of the sixth slice of the subject.

In addition, the number of imaging operations by the multi-shot EPI sequence is two (NSA=2), and the number of shots by each multi-shot EPI sequence is four. Imaging operations of four shots×two NSA are performed in correspondence with each of the reconstructed images MPG1, MPG2, and MPG3, and eight navigator scan images corresponding to four shots×two NSA and two maps showing G-factor for two NSA are shown.

Here, it is known that the SNR of the separated image (separation image) consisting of the signals separated by the parallel imaging method is inversely proportional to an indicator called a Geometry-factor (G-factor). In a case where the difference in sensitivity between the reception coils at spatially overlapping signal positions is small, the G-factor increases, and the SNR decreases. The G-factor can be said to be an indicator for evaluating image quality.

The G-factor can be calculated by the following equation.

$$G = \left\{ \left( B^H \sum{}^{-1} B \right)^{-1} B^H \sum{}^{-1} B \right\}^{1/2}$$ [Equation 8]

In FIG. 7, it can be seen that the G-factor corresponding to the reconstructed image MPG3 along the third axis is increased. This is considered to be due to the application direction of the MPG pulse along the third axis being the same as or close to the direction of the body motion of the subject, resulting in a decrease in SNR.

Figure 8:
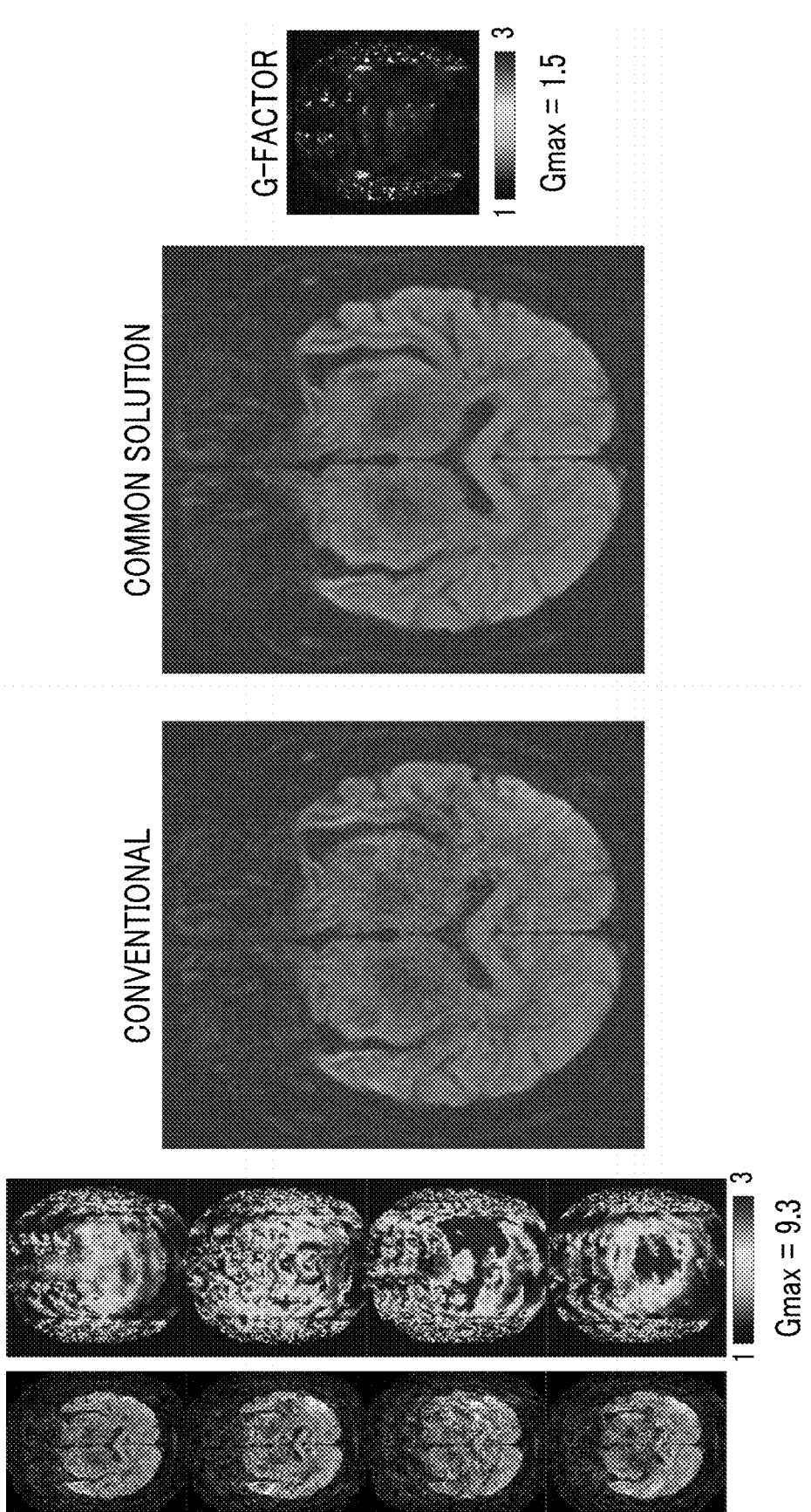
FIG. 8 is a view showing a comparative example showing the reconstructed image and a G-factor map generated by the conventional reconstruction method, and a reconstructed image and a G-factor map generated by the reconstruction method of the embodiment of the present invention.

FIG. 8 is a comparative example showing a reconstructed image and a G-factor map generated by the conventional reconstruction method, and a reconstructed image and a G-factor map generated by the reconstruction method of the embodiment of the present invention.

In the example shown in FIG. 8, the number of imaging operations by the multi-shot EPI sequence is four.

FIG. 8 shows four images for each NSA and four G-factor maps, and a single reconstructed image obtained through arithmetic mean of the four images in the related art, and the reconstructed image and the G-factor map generated based on the common solution of the embodiment of the present invention.

The maximum value of the G-factor map according to the conventional reconstruction method was 9.3, but the maximum value of the G-factor map according to the reconstruction method of the embodiment of the present invention was 1.5.

As described above, it can be said that the G-factor according to the reconstruction method of the embodiment of the present invention is smaller than the G-factor according to the conventional reconstruction method, and the SNR is improved.

Figure 9:
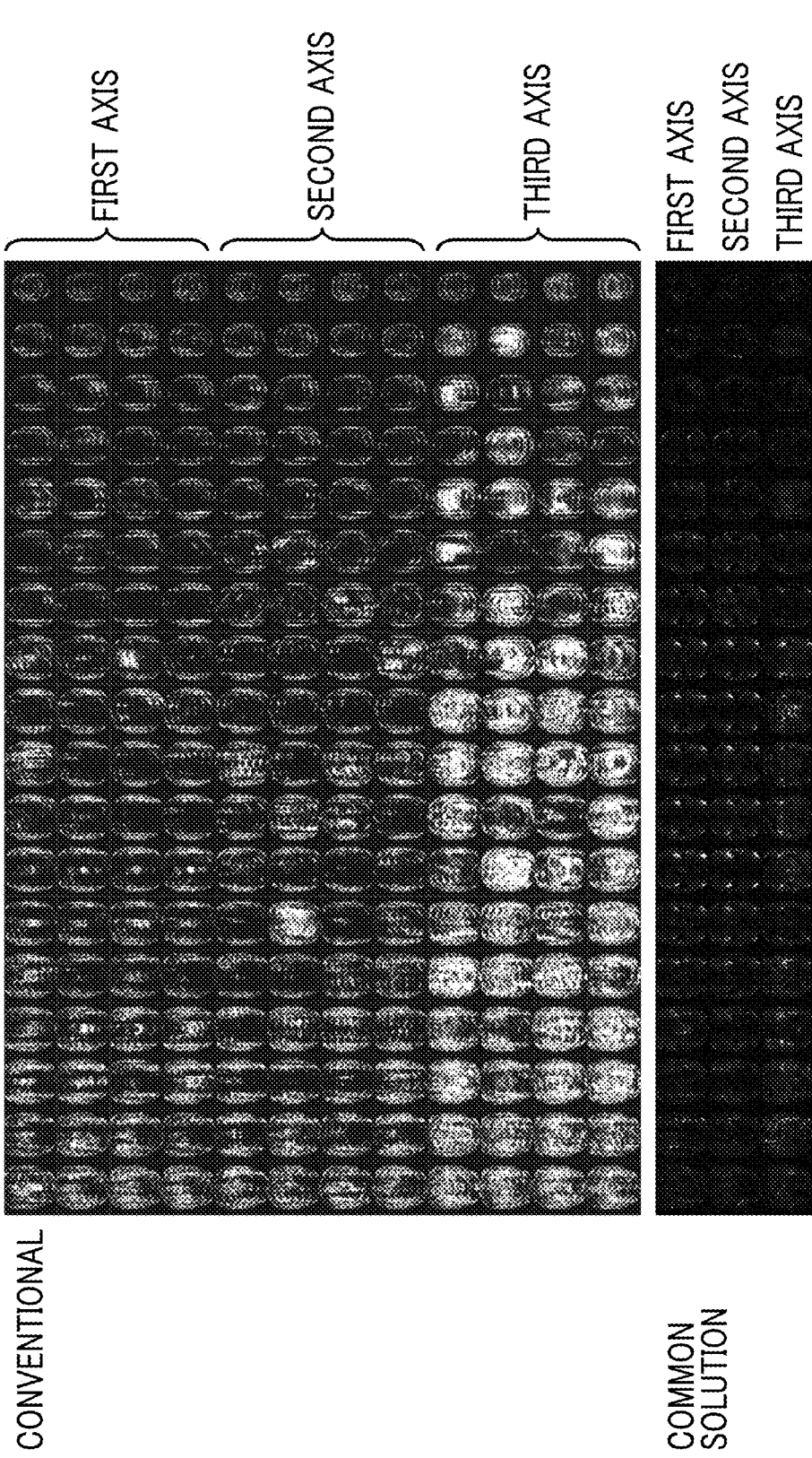
FIG. 9 is a view showing G-factor maps of all slices according to the conventional reconstruction method and G-factor maps of all slices according to the reconstruction method of the embodiment of the present invention.

FIG. 9 is a view showing G-factor maps of all slices according to the conventional reconstruction method and G-factor maps of all slices according to the reconstruction method of the embodiment of the present invention.

FIG. 9 shows G-factor maps of three axes (first axis, second axis, and third axis) in which the application directions of the MPG pulses are different for all slices (18 slices) of the subject. In addition, in the example shown in FIG. 9, as in the case of FIG. 8, the number of imaging operations by the multi-shot EPI sequence is four.

Therefore, the G-factor maps according to the conventional reconstruction method shown in FIG. 9 are 216 sheets (=18 slices×4 shots×3 axes), and the G-factor maps according to the reconstruction method of the embodiment of the present invention are 54 sheets (=18 slices×1×3 axes).

The G-factor map according to the conventional reconstruction method shown in FIG. 9 shows a large value in the third axis as compared with the first axis and the second axis, but the G-factor map according to the reconstruction method of the embodiment of the present invention shows a low value in any axis of the three axes.

That is, it is considered to be due to the application direction of the MPG pulse along the third axis being the same as or close to the direction of the body motion of the subject. In addition, in the conventional reconstruction method, blurring and artifacts of the reconstructed image along the third axis are not sufficiently removed, resulting in a low SNR. On the other hand, in the reconstruction method of the embodiment of the present invention, it can be seen that blurring and artifacts of the reconstructed image along the third axis are removed, and the SNR is increased, as in the first axis and the second axis.

Figure 10:
FIG. 10 is an enlarged view of a part of the G-factor maps according to the reconstruction method of the embodiment of the present invention shown in FIG. 9.
Figure 10:
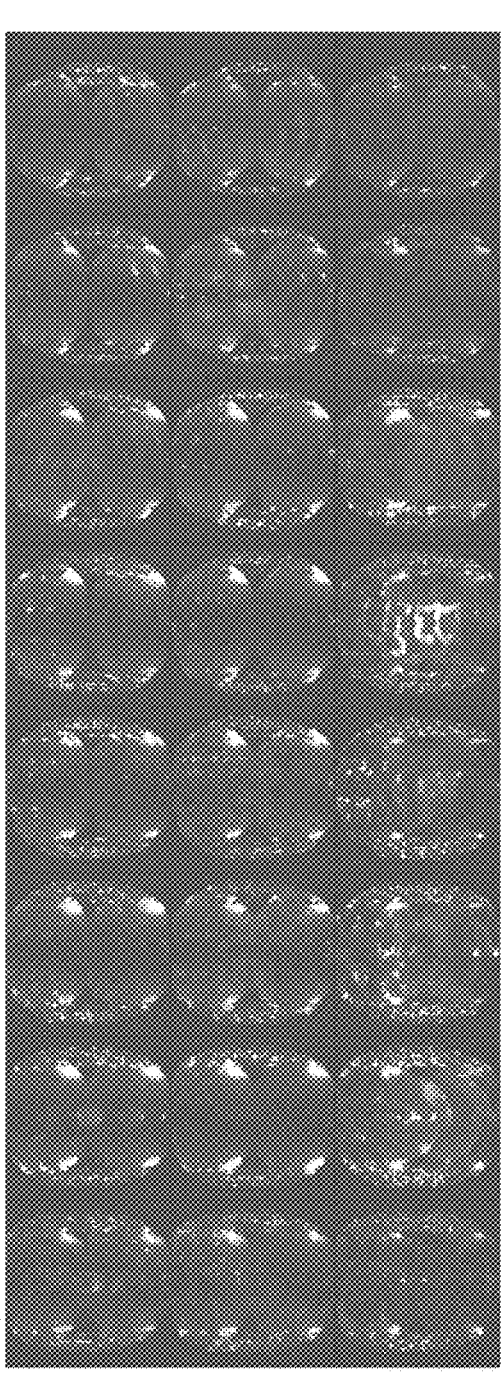

FIG. 10 is an enlarged view of a part (the 6th slice to the 13th slice) of the G-factor maps according to the reconstruction method of the embodiment of the present invention shown in FIG. 9.

In the reconstruction method of the embodiment of the present invention, the condition (=G-factor) is improved by increasing the number of equations with respect to the number of solutions.

Figure 11:
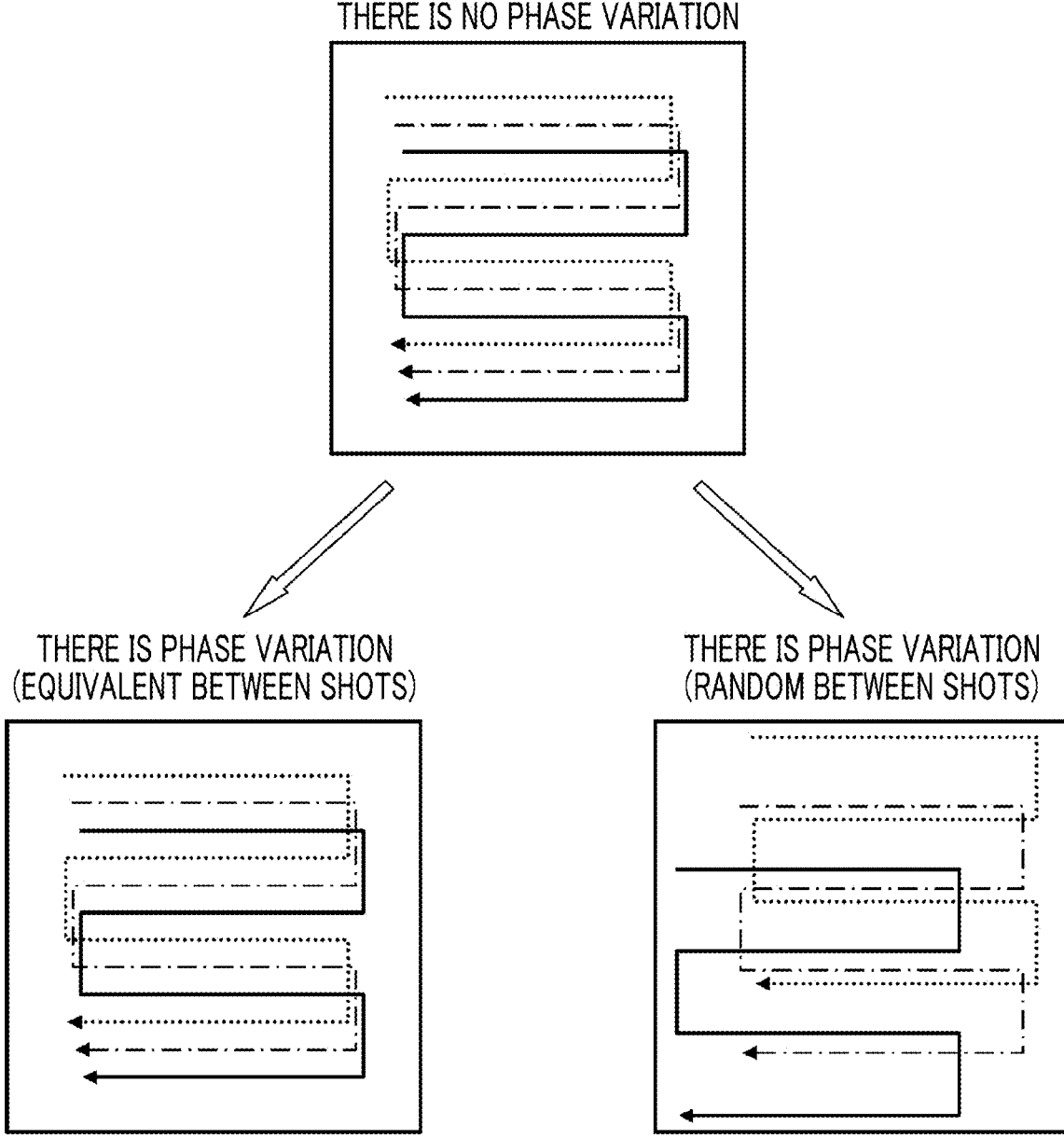
FIG. 11 is a diagram showing a k-space in which each echo signal in a case where the number of shots of the multi-shot EPI sequence is three is disposed.

FIG. 11 is a diagram showing a k-space in which each echo signal in a case where the number of shots $N_{sh}$ of the multi-shot EPI sequence is three is disposed.

In a case where there is no phase variation in three shots, there are cases where equivalent phase variations occur between shots and where phase variations occur randomly between shots. The variation in phase can be considered as the variation in trajectory in the k-interval, and it is also considered that the coverage of the k-space is improved in the reconstruction method of the embodiment of the present invention.

The present invention is not limited to the multi-shot sequence and can be applied to the single-shot sequence.

Figure 12:
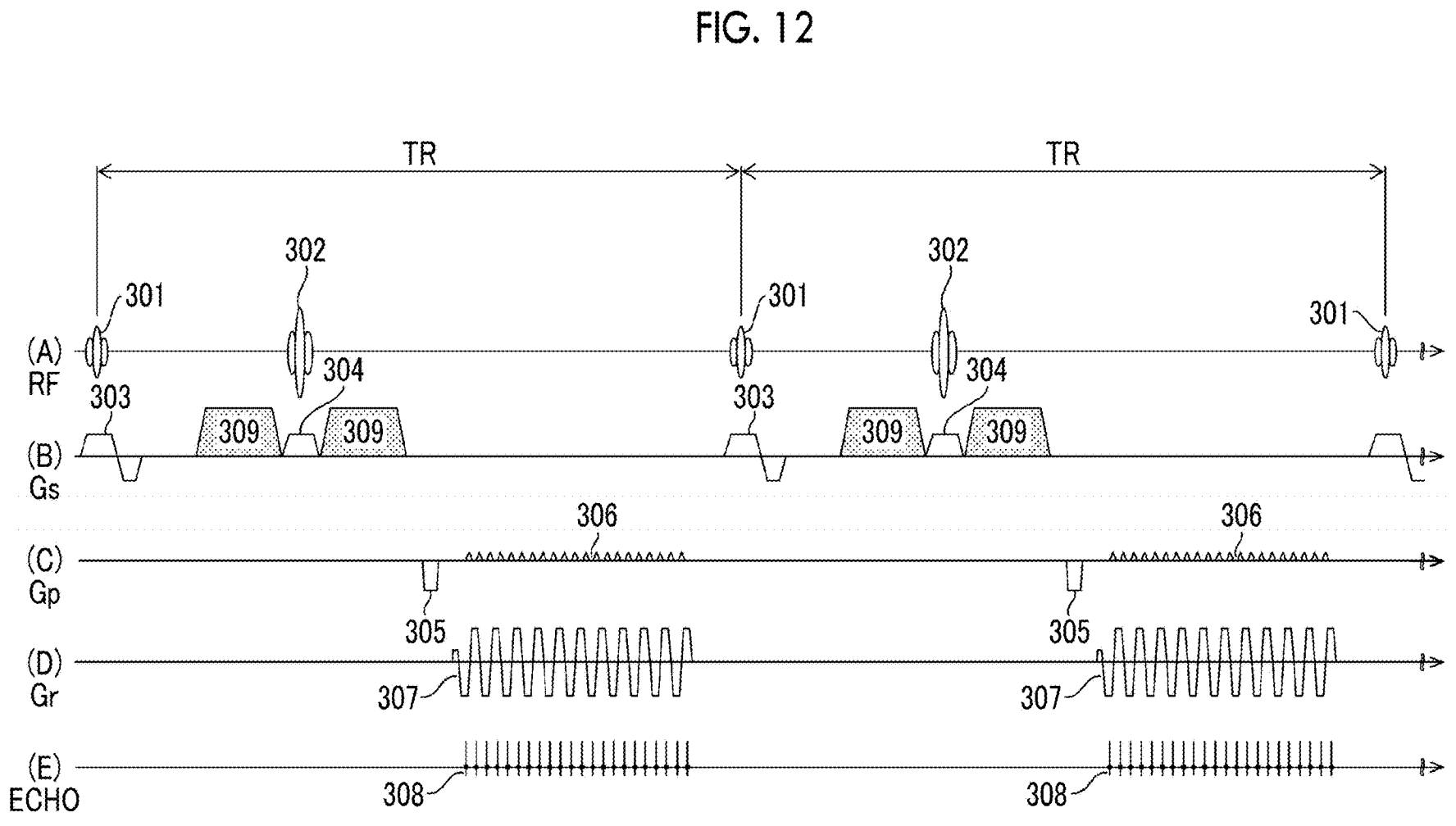

FIG. 12 is a diagram showing an example of the single-shot EPI sequence.

(A) of FIG. 12 shows the application timing of the RF pulse, (B), (C), and (D) of FIG. 12 show the application timings of the gradient magnetic field pulses in the slice direction, the phase-encoding direction, and the readout direction, respectively, and (E) of FIG. 12 shows the acquisition timing of the echo signal.

In order to improve the SNR of the DWI captured and reconstructed by the single-shot EPI sequence, the single-shot EPI sequence is executed a plurality of times, and a plurality of imaging operations are performed on the same slice of the subject.

As shown in FIG. 12, in the single-shot EPI sequence, the slice selection gradient magnetic field 303 and the excitation RF pulse 301 are applied, and then the inversion RF pulse 302 is applied together with the slice selection gradient magnetic field 304 to excite a desired slice. The MPG pulse 309 having a large intensity is applied before and after this inversion RF pulse 302. Subsequently, the phase-encoding gradient magnetic field 305 is applied, and then the blipped phase-encoding gradient magnetic field 306 and the readout gradient magnetic field 307 with inverted polarity are continuously applied, and the main echo signal 308 is collected during the application of the inverting readout gradient magnetic field 307.

The navigator echo signal may be collected separately from the main echo signal 308. The navigator echo signal in this case can be used for distortion correction of the reconstructed image to be reconstructed from the main echo signal 308.

In addition, the single-shot EPI sequence of the present example is a single-shot sequence to which the parallel imaging method is applied. That is, measurement lines thinned out to 1/R in the phase-encoding direction of the k-space by setting the reduction factor R of the parallel imaging method are thinned out in the phase-encoding direction according to the reduction factor R and collected in a single measurement.

Here, in a case where the reduction factor R of the parallel imaging method applied to the single-shot EPI sequence is set to 3 (R=3), the pieces of measurement data thinned out to 1/R in the phase-encoding direction of the k-space are further thinned out to ⅓ in the phase-encoding direction of the k-space, are collected in a single measurement, and are disposed in the k-space.

In a case of the single-shot EPI sequence, the calculation of the phase shift matrix A can be omitted because there is no k-space disposition error as compared with the multi-shot EPI sequence. In addition, the calculation of the phase variation matrix P can be omitted because there is no influence of the phase variation caused by the body motion of the subject between shots. Therefore, the matrix B described above can be represented solely by the coil sensitivity matrix C (B=C).

The coil sensitivity matrix C can be measured by executing the reference scan in advance, and the phase shift matrix A can also be used in common after being measured once. Therefore, the common solution D shown in [Equation 5] or [Equation 7] can be calculated in advance and stored in the memory 204.

As a result, in a case of the single-shot EPI sequence, the final image can be generated based on the intermediate images $S_{all}$ acquired by the plurality of imaging operations and the common solution D (for example, the matrix D read out from the memory 204).

Operation Method of Magnetic Resonance Imaging System

Figure 13:
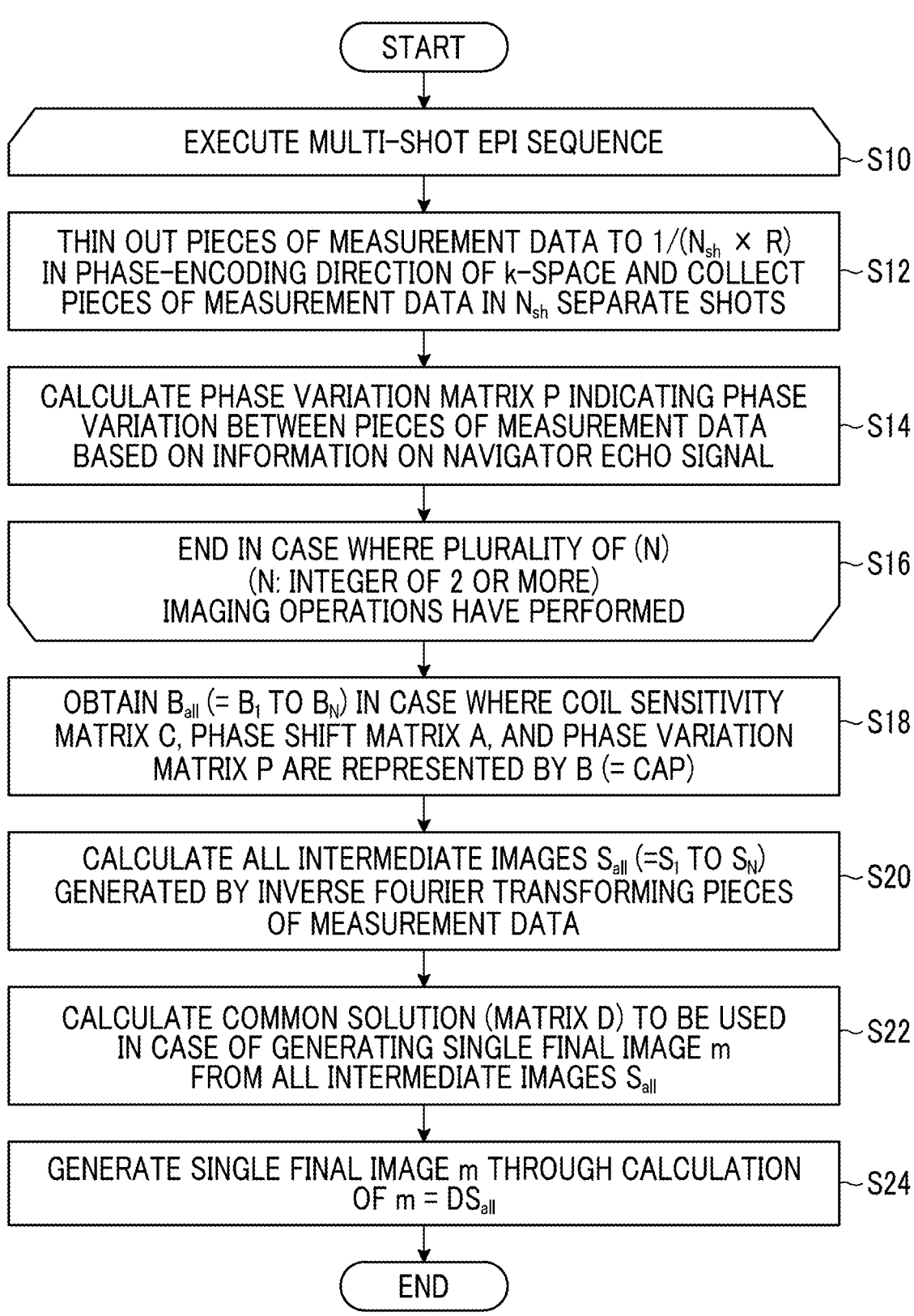
FIG. 13 is a flowchart showing an embodiment of an operation method of the magnetic resonance imaging system according to the embodiment of the present invention.

FIG. 13 is a flowchart showing an embodiment of an operation method of the magnetic resonance imaging system according to the embodiment of the present invention.

The processing of each step of the operation method of the magnetic resonance imaging system shown in FIG. 13 corresponds to the processing performed by the processor 202 of the control apparatus 200 shown in FIG. 1.

In FIG. 13, the processor 202 executes the multi-shot EPI sequence (step S10). In a case where the number of shots in the multi-shot EPI sequence is denoted by $N_{sh}$ ($N_{sh}$: an integer of 2 or more), and the reduction factor of the parallel imaging method is denoted by R (R: a real number of more than 1), pieces of measurement data are thinned out to $1/(N_{sh} \times R)$ in the phase-encoding direction of the k-space according to $N_{sh} \times R$ and collected in $N_{sh}$ separate shots from the MRI apparatus 100 (step S12). In the present example, a set of the main echo signal and the navigator echo signal is acquired.

The processor 202 calculates the phase variation matrix P indicating the phase variation between the pieces of measurement data caused by the body motion of the subject based on the information on the navigator echo signal (step S14).

In a case where the number of the plurality of imaging operations by the multi-shot EPI sequence is set to N (N: an integer of 2 or more), it is determined whether or not N imaging operations have ended, and the processing from step S10 to step S16 is repeated until the N imaging operations end (step S16).

Next, the processor 202 obtains the matrix $B_{all}$ (=$B_1$ to $B_N$) corresponding to the N imaging operations in a case where the coil sensitivity matrix C, the phase shift matrix A, and the phase variation matrix P calculated in step S14 are represented by the matrix B (=CAP) (step S18). The coil sensitivity matrix C and the phase shift matrix A can be used by being measured in advance through a reference scan or the like and being stored in the memory 204.

The processor 202 performs inverse Fourier transformation on the pieces of measurement data to calculate all the intermediate images $S_{all}$ (=$S_1$ to $S_N$) (step S20).

Subsequently, the processor 202 calculates the common solution (matrix D) to be used in a case of generating the single final image m from all the intermediate images $S_{all}$ by using [Equation 5] or [Equation 7] (step S22).

Finally, the processor 202 generates the single final image m from all the intermediate images $S_{all}$ and the matrix D by using [Equation 6] (step S24).

OTHERS

The imaging sequence applied to the present invention is not limited to the multi-shot EPI sequence and the single-shot EPI sequence, and various sequences can be applied, and various modifications such as a combination of the known techniques for image reconstruction can be made.

In addition, in the present embodiment, for example, the hardware structure of the processing unit that executes various types of processing, such as the CPU, is the following various processors. The various processors include a central processing unit (CPU), which is a general-purpose processor executing software (programs) to function as various processing units, a programmable logic device (PLD), which is a processor whose circuit configuration can be changed after manufacturing, such as a field programmable gate array (FPGA), a dedicated electrical circuit, which is a processor having a dedicated circuit configuration designed to execute specific processing, such as an application specific integrated circuit (ASIC), and the like.

One processing unit may be configured with one of these various processors or two or more processors of the same type or different types (for example, a plurality of FPGAs or a combination of a CPU and an FPGA). Moreover, a plurality of processing units may be configured with one processor. A first example of the configuration in which a plurality of processing units are configured with one processor is an aspect in which one or more CPUs and software are combined to configure one processor, and the processor functions as the plurality of processing units, as typified by a computer such as a client and a server. A second example of the configuration is an aspect in which a processor that implements the functions of the entire system including a plurality of processing units by using one integrated circuit (IC) chip is used, as typified by a system-on-chip (SoC). As described above, various processing units are configured by using one or more of the above-described various processors as the hardware structure.

In addition, more specifically, the hardware structure of these various processors is an electrical circuit (circuitry) in which circuit elements such as semiconductor elements are combined.

Furthermore, it is needless to say that the present invention is not limited to the above-described embodiments and various modifications can be made without departing from the spirit of the present invention.

EXPLANATION OF REFERENCES

10: magnetic resonance imaging system
100: MRI apparatus
102: subject
104: static magnetic field generating magnet
106: gradient magnetic field coil
108: transmission coil
110: reception coil
112: high-frequency magnetic field generator
114: receiver
116: gradient magnetic field power supply
118: sequencer
200: control apparatus
202: processor
204: memory
206: input/output interface
208: display
210: operation unit

What is claimed is:
1. A magnetic resonance imaging system comprising:
a magnetic resonance imaging apparatus;
a processor; and
at least one memory,
wherein the processor is configured to:
  use the magnetic resonance imaging apparatus to perform a plurality of imaging operations on the same slice of a subject in accordance with an imaging sequence;
  collect pieces of measurement data indicating nuclear magnetic resonance signals in correspondence with the plurality of imaging operations from the magnetic resonance imaging apparatus;
  acquire a common solution to be used in a case of generating a single final image in a real space from the pieces of measurement data collected in the plurality of imaging operations; and
  generate the final image by using the pieces of measurement data collected in the plurality of imaging operations and the common solution.
2. The magnetic resonance imaging system according to claim 1,
wherein the imaging sequence is a multi-shot sequence or a single-shot sequence, and the multi-shot sequence or the single-shot sequence is executed a plurality of times.
3. The magnetic resonance imaging system according to claim 2,
wherein the processor is configured to generate a diffusion weighted image as the final image.
4. The magnetic resonance imaging system according to claim 1,
wherein the magnetic resonance imaging apparatus includes a reception coil consisting of multiple-array coils of $N_{ch}$ channels, the processor is configured to, in a case where the number of shots in the imaging sequence is denoted by $N_{sh}$, collect $N_{ch} \times N_{sh}$ pieces of measurement data through a single imaging operation, in a case where a determinant, where $N_{ch} \times N_{sh}$ sheets of intermediate images in the real space, which are obtained by inverse Fourier transforming the $N_{ch} \times N_{sh}$ pieces of measurement data, for each of N imaging operations where N represents the number of the plurality of imaging operations are denoted by $S_i$ (i=1 to N) and the final image is denoted by m, is represented by [Equation 1], $$[S_i] = [B_i]m \qquad \text{[Equation 1]}$$

(where $B_i$ represents a matrix $B_i$ (i=1 to N) including a coil sensitivity matrix), the common solution calculated by [Equation 1], which is denoted by D, is represented by [Equation 2], $$D = \left(B_{all}^{H} \sum{}^{-1} B_{all}\right)^{-1} B_{all}^{H} \sum{}^{-1} \qquad \text{[Equation 2]}$$

(where $B_{all}$ represents the matrix $B_i$ (i=1 to N), and $\Sigma$ represents a noise correlation matrix between the $N_{ch}$ channels of the reception coil), and the processor is configured to:
  generate the $N_{ch} \times N_{sh}$ sheets of intermediate images $S_i$ by inverse Fourier transforming the $N_{ch} \times N_{sh}$ pieces of measurement data; and
  generate the final image m based on the common solution D and intermediate images $S_{all}$, which are all the intermediate images $S_i$ generated for each of the N imaging operations, by using [Equation 3], $$m = DS_{all}. \qquad \text{[Equation 3]}$$

5. The magnetic resonance imaging system according to claim 4,
wherein the imaging sequence is a single-shot sequence to which a parallel imaging method is applied,
the memory is configured to store the common solution D, and
the processor is configured to acquire the common solution D from the memory.
6. The magnetic resonance imaging system according to claim 4,
wherein the imaging sequence is a multi-shot sequence,
in a case where the number of shots of the multi-shot sequence is denoted by $N_{sh}$, and a reduction factor of a parallel imaging method is denoted by R, the pieces of measurement data, which are disposed by the number of lines thinned out to 1/R in a phase-encoding direction of a k-space, are thinned out to $1/(N_{sh} \times R)$ in the phase-encoding direction and are collected in $N_{sh}$ separate shots,
the matrix $B_i$ includes a coil sensitivity matrix of the reception coil consisting of the $N_{ch}$ channels, a phase shift matrix indicating a phase shift corresponding to a k-space disposition error of the pieces of measurement data collected in the $N_{sh}$ separate shots, and a phase variation matrix indicating a phase variation caused by a body motion of the subject between the pieces of measurement data collected in the $N_{sh}$ separate shots, and the processor is configured to calculate the common solution D based on the coil sensitivity matrix, the phase shift matrix, the phase variation matrix, and the noise correlation matrix between the $N_{ch}$ channels of the reception coil.

7. The magnetic resonance imaging system according to claim 6, wherein the multi-shot sequence includes a main scan and a navigator scan for acquiring a main echo signal and a navigator echo signal as the pieces of measurement data, the memory is configured to store the coil sensitivity matrix, the phase shift matrix, and the noise correlation matrix, and the processor is configured to acquire the coil sensitivity matrix, the phase shift matrix, and the noise correlation matrix from the memory and calculate the phase variation matrix based on the navigator echo signals of the $N_{sh}$ shots.

8. The magnetic resonance imaging system according to claim 1, wherein the magnetic resonance imaging apparatus includes a reception coil consisting of multiple-array coils of $N_{ch}$ channels, the processor is configured to, in a case where the number of shots in the imaging sequence is denoted by $N_{sh}$, collect $N_{ch} \times N_{sh}$ pieces of measurement data through a single imaging operation, in a case where a determinant, where $N_{ch} \times N_{sh}$ sheets of intermediate images in the real space, which are obtained by inverse Fourier transforming the $N_{ch} \times N_{sh}$ pieces of measurement data, for each of N imaging operations where N represents the number of the plurality of imaging operations are denoted by $S_i$ (i=1 to N) and the final image is denoted by m, is represented by [Equation 1], $$[S_i] = [B_i]m \qquad \text{[Equation 1]}$$

(where $B_i$ represents a matrix $B_i$ (i=1 to N) including a coil sensitivity matrix), the common solution calculated by [Equation 1], which is denoted by D, is represented by [Equation 2], $$D = \left(B_{all}^H B_{all}\right)^{-1} B_{all}^H \qquad \text{[Equation 2]}$$

(where $B_{all}$ represents the matrix $B_i$ (i=1 to N)), and the processor is configured to:

generate the $N_{ch} \times N_{sh}$ sheets of intermediate images $S_i$ by inverse Fourier transforming the $N_{ch} \times N_{sh}$ pieces of measurement data; and generate the final image m based on the common solution D and intermediate images $S_{all}$, which are all the intermediate images $S_i$ generated for each of the N imaging operations, by using [Equation 3], $$m = DS_{all}. \qquad \text{[Equation 3]}$$

9. The magnetic resonance imaging system according to claim 8, wherein the imaging sequence is a multi-shot sequence, in a case where the number of shots of the multi-shot sequence is denoted by $N_{sh}$, and a reduction factor of a parallel imaging method is denoted by R, the pieces of measurement data, which are disposed by the number of lines thinned out to 1/R in a phase-encoding direction of a k-space, are thinned out to $1/(N_{sh} \times R)$ in the phase-encoding direction and are collected in $N_{sh}$ separate shots, the matrix $B_i$ includes a coil sensitivity matrix of the reception coil consisting of the $N_{ch}$ channels, a phase shift matrix indicating a phase shift corresponding to a k-space disposition error of the pieces of measurement data collected in the $N_{sh}$ separate shots, and a phase variation matrix indicating a phase variation caused by a body motion of the subject between the pieces of measurement data collected in the $N_{sh}$ separate shots, and the processor is configured to calculate the common solution D based on the coil sensitivity matrix, the phase shift matrix, the phase variation matrix, and the noise correlation matrix between the $N_{ch}$ channels of the reception coil.

10. The magnetic resonance imaging system according to claim 8, wherein the multi-shot sequence includes a main scan and a navigator scan for acquiring a main echo signal and a navigator echo signal as the pieces of measurement data, the memory is configured to store the coil sensitivity matrix, the phase shift matrix, and the noise correlation matrix, and the processor is configured to acquire the coil sensitivity matrix, the phase shift matrix, and the noise correlation matrix from the memory and calculate the phase variation matrix based on the navigator echo signals of the $N_{sh}$ shots.

11. An operation method of a magnetic resonance imaging system including a magnetic resonance imaging apparatus, a processor, and at least one memory, the operation method comprising:

a step of, through the processor, using the magnetic resonance imaging apparatus to perform a plurality of imaging operations on the same slice of a subject in accordance with an imaging sequence;

a step of, through the processor, collecting pieces of measurement data indicating nuclear magnetic resonance signals in correspondence with the plurality of imaging operations from the magnetic resonance imaging apparatus;

a step of, through the processor, acquiring a common solution to be used in a case of generating a single final image in a real space from the pieces of measurement data collected in the plurality of imaging operations; and a step of, through the processor, generating the final image by using the pieces of measurement data collected in the plurality of imaging operations and the common solution.

\*　\*　\*　\*　\*